(12) United States Patent
Handtmann et al.

(10) Patent No.: US 7,728,485 B2
(45) Date of Patent: Jun. 1, 2010

(54) BULK ACOUSTIC WAVE DEVICE AND A METHOD OF ITS MANUFACTURING

(75) Inventors: Martin Handtmann, Munich (DE); Martin Franosch, Munich (DE)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 181 days.

(21) Appl. No.: 12/130,756

(22) Filed: May 30, 2008

(65) Prior Publication Data

US 2009/0295506 A1    Dec. 3, 2009

(51) Int. Cl.
*H01L 41/053*  (2006.01)
*H03H 9/02*  (2006.01)
*H01L 41/22*  (2006.01)
*H04R 17/10*  (2006.01)
*C23F 1/00*  (2006.01)

(52) U.S. Cl. .................. 310/320; 310/321; 29/25.35; 216/2; 216/39

(58) Field of Classification Search .................. 310/320, 310/321, 322; 333/187; 29/25.35; 216/2, 216/39, 52
See application file for complete search history.

(56) References Cited

U.S. PATENT DOCUMENTS

| | | | |
|---|---|---|---|
| 7,180,224 B2 * | 2/2007 | Bouche et al. ............... | 310/320 |
| 7,559,128 B2 * | 7/2009 | Kitagawa et al. ............ | 29/25.35 |
| 7,596,840 B2 * | 10/2009 | Iwashita et al. ............. | 29/25.35 |
| 2004/0027216 A1 * | 2/2004 | Ma et al. ..................... | 333/187 |
| 2006/0273866 A1 * | 12/2006 | Vilander ..................... | 333/187 |
| 2006/0284707 A1 * | 12/2006 | Larson et al. ............... | 333/187 |
| 2006/0290446 A1 | 12/2006 | Aigner et al. | |
| 2008/0055020 A1 | 3/2008 | Handtmann et al. | |

FOREIGN PATENT DOCUMENTS

| | | |
|---|---|---|
| CN | 101154934 A | 4/2008 |
| EP | 1 895 660 A2 | 3/2008 |
| JP | -62-233914 | * 10/1987 |

OTHER PUBLICATIONS

Sze, S., "Semiconductor Devices: Physics and Technology," 2nd Edition, Chapter 7: MIS Diode and Charge-Coupled Device, pp. 362-427, 1981, John Wiley & Sons, Inc., Hoboken, NJ.
Rong, B., et al., "Surface-Passivated High-Resistivity Silicon Substrates for RFICs," IEEE Electron Device Letters, vol. 25, No. 4, Apr. 2004, pp. 176-178, IEEE.
Aigner, R., et al., "Behavior of BAW Devices at High Power levels," 2005 IEEE MTT-S International Microwave Symposium Digest, Jun. 12-17, 2005, pp. 429-432, IEEE.

* cited by examiner

*Primary Examiner*—Thomas M Dougherty

(57) ABSTRACT

A BAW device includes a semiconductor substrate with a surface region, an insulating layer formed on the surface region and a piezoelectric layer sandwiched by a first and second electrode, wherein the second electrode is formed on the insulating layer. The surface region is performed such that a voltage dependence of a capacitance between the substrate and the second electrode is substantially suppressed.

26 Claims, 13 Drawing Sheets

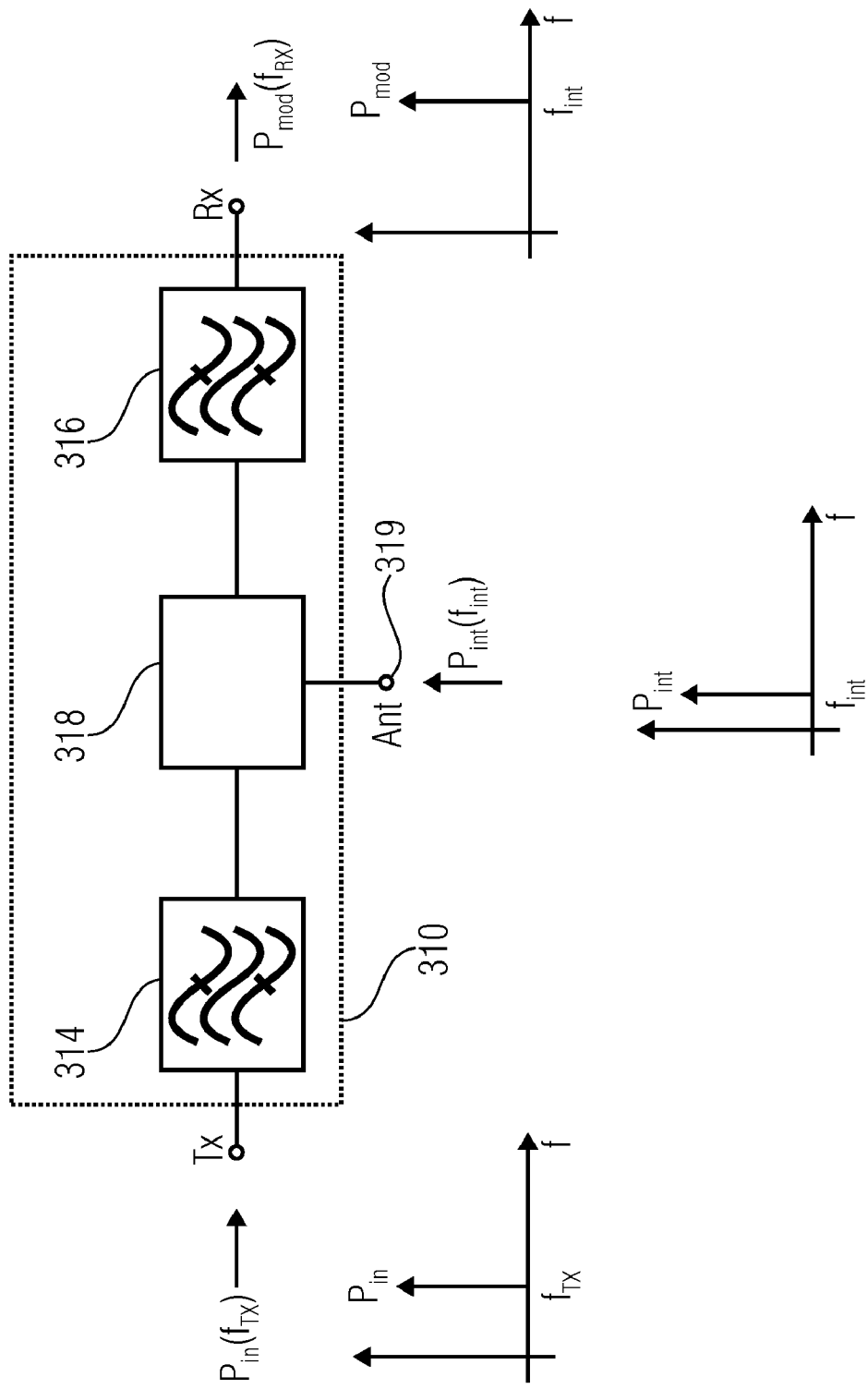

BULK ACOUSTIC WAVE DEVICE AND A METHOD OF ITS MANUFACTURING

BACKGROUND

The present invention relates to a bulk acoustic wave (BAW) device and especially to a BAW device with a suppressed nonlinear behavior when transmitting a high power signal.

SUMMARY OF THE INVENTION

Embodiments of the present invention relate to a BAW device comprising a semiconductor substrate with a surface region, an insulating layer formed on the surface region and a piezoelectric layer sandwiched by a first and second electrode, wherein the second electrode is formed on the insulating layer. The surface region is performed such that a voltage dependence of a capacitance between the substrate and the second electrode is substantially suppressed.

BRIEF DESCRIPTION OF THE DRAWINGS

Embodiments of the present invention will be explained in the following with reference to the accompanying drawings, in which:

FIG. 3 shows an example for intermodulation in a duplexer;

FIG. 6, shows a cross sectional view of a surface region of the substrate according to embodiments;

Before embodiments of the present invention will be explained in greater detail in the following on the basis of the drawings, it is pointed out that like elements in the figures are provided with the same or similar reference numbers and that a repeated description of these elements is omitted.

DETAILED DESCRIPTION OF ILLUSTRATIVE EMBODIMENTS

Figure 1:
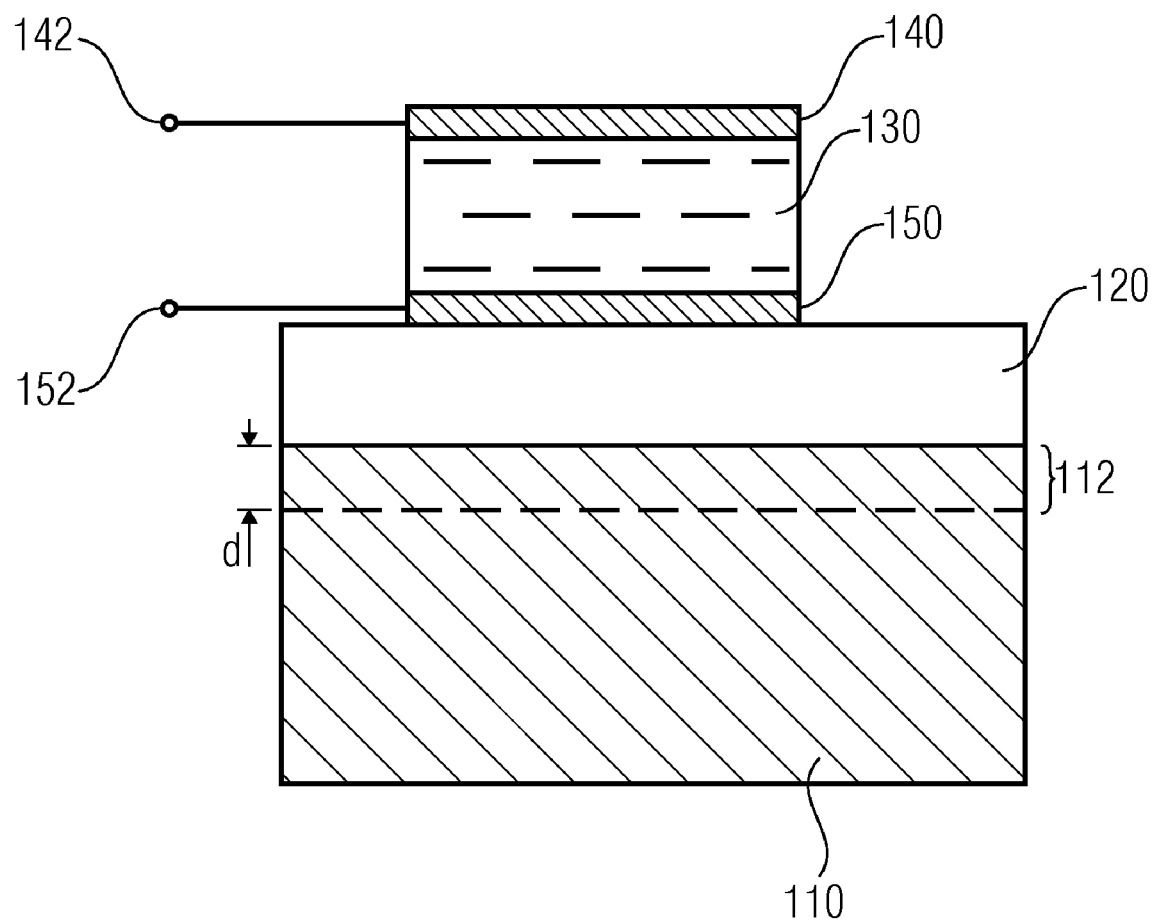
FIG. 1 shows a cross-sectional view of a bulk acoustic wave device formed on a substrate according to embodiments of the present invention.

BAW devices exhibit a nonlinear behavior, when these devices transmit a high power signal. This problem arises, for example, in antenna-duplexers when transmit power levels exceed, for example, 0.1 W.

Two dominant effects characterize this nonlinear behavior:
(1) The generation of pronounced higher harmonics can be observed in the output spectrum of the duplexer, and
(2) An intermodulation occurs either within a modulated, high power signal or between the high power signal and an additional interferer.

These nonlinear effects can cause, for example, signal distortion in the signal chain of mobile handset and as a consequence a degraded signal reception. Therefore, these nonlinearities should be reduced to a minimum such that they do not interfere with the transmit signal.

An extreme energy density present in the active layers of a BAW device at high power level is one possible root cause for this nonlinearity. For example, the piezo-effect itself is no longer following a strictly linear relationship between the stress and the electric field.

Several techniques are possible to compensate the second order effects of this electro-acoustical nonlinearity. One technique uses two similar resonators in anti-parallel configuration to cancel out the even harmonic modes. Another technique comprises using an improved BAW device comprising an inherently electro-acoustical compensation.

BAW resonators, which are mounted on a semiconductor substrate, comprise a further additional root cause for nonlinear behavior of the BAW device and a new technique is needed for such BAW resonators to cancel the corresponding nonlinear behavior.

This further root cause is due to the effect that Metal-Insulator-Semiconductor (MIS) structures exhibit a voltage and frequency dependent capacitance. This is due to a charge distribution (due to an applied voltage) in a semiconductor surface region, which changes from accumulation over depletion into inversion dependent on the applied voltage. Thereby, among other things, the semiconductor material, its doping, charges in the insulator as well as surface charges define the exact characteristics of this non-linear capacitance and hence the non-linear behavior of the BAW device.

If the substrate of a BAW device comprises a semiconductor material, a parasitic MIS capacitance is formed underneath the BAW resonator, or more generally, underneath a BAW device (for example, a filter device comprising a stacked crystal filter). The following cases are to be distinguished.

For a solidly mounted resonator (SMR) with a dielectric mirror, used to acoustically decouple the BAW resonator from the substrate, the MIS capacitance comprises the elements: the substrate, the lower resonator electrode and the dialectic mirror.

If the mirror of a SMR comprises conductive sheets, the MIS capacitance is formed between the substrate, the conductive layer closest to the substrate and the dielectric layer in between. The conductive layer can, for example, comprise tungsten, which is often used as material for high acoustic impedance in an acoustic mirror.

Since such a MIS capacitance is also formed underneath the respective resonator interconnections, this effect is not limited to solidly mounted resonators (SMR) and applied also to membrane type devices. Here, the MIS capacitance, for example, comprises the structures: the substrate, the dielectric layer(s) for isolation of the interconnection from the substrate, and the resonator interconnect.

As a consequence, the parasitic electrical fields between resonators and/or interconnections and the same substrate, or between a resonator or an interconnection and a ground plane underneath the substrate shows a nonlinear characteristic. Therefore, this (nonlinear) characteristic is another root cause for the nonlinearity of a BAW device. Thereby, this nonlinearity depends among others on the dielectric layer stack between the conducting layer (a BAW bottom electrode, for example) and the substrate and the geometrical layout of the BAW device (filter).

There is a growing need to compensate or to suppress the non-linearity and especially to suppress the voltage and frequency dependent capacitance.

In embodiments of the present invention, a semiconductor substrate of a BAW device comprises a surface region with an increased bandgap, very high trap density (high probability of trapping free charge carriers) and/or reduced carrier mobility, an isolating layer formed between the surface region and an electrode layer of the BAW device. Therefore, the idea of embodiments rely on a cancellation between nonlinearities by using for a BAW device a semiconductor substrate, wherein a monocrystalline structure in a surface region is converted into an amorphous or polycrystalline structure, with, compared to the bulk region, an increased bandgap, very high trap density and at least 100 times reduced carrier mobility (optionally the semiconductor energy bands may be omitted).

A prerequisite for a MIS capacitance is that the energy states of the semiconductor are so-called energy bands. These energy bands emerge from discrete energy states of a single atom by arranging the atoms within a monocrystalline structure. Therefore, if the monocrystalline structure is broken up in the surface region of the semiconductor, results in an increased bandgap, very high trap density and/or an reduced carrier mobility and as a consequence the typical voltage dependent MIS capacitance is suppressed.

Thereby, the thickness of this nonmonocrystalline surface region should be at least in the region of the accumulation, depletion or inversion layers of the according MIS capacitance for a monocrystalline surface region. Since the thickness of the accumulation, depletion or inversion layer depends, among other things, on the semiconductor material and its doping, it can typically range from a few nanometers up to some hundreds of micrometers. Therefore, embodiments comprise for the surface region a thickness within this range of a few nanometers up to some hundred micrometers.

Since, for example, amorphous silicon (aSi) comprises no crystalline structure, it satisfies intrinsically the above condition. In addition, since a single grain of a polysilicon material is monocrystalline, the grain size here should be much smaller compared to a typical resonator structure size and the thickness of the surface region.

Several processes are possible to create such a substrate. One possibility is to deposit an amorphous silicon layer on top of a silicon substrate to convert the monocrystalline to an amorphous structure. Equally, a polysilicon surface can be deposited to convert the monocrystalline structure at the surface into a polycrystalline structure. In this case the grain size of the polysilicon structure should be much smaller than the structure sizes/area of the resonator. Another technique is to amorphize the monocrystalline structure of the semiconductor substrate mechanically, for example, by implantation of ions.

In further embodiments the substrate comprises other semiconductor materials (not silicon), but the creation of the surface structure with a deteriorated lattice structure can be done in an equivalent way. This means, that it is not needed to add a layer of another material to the substrate, but instead the lattice structure of a given substrate material can be deteriorated such that the resulting material comprises an increased bandgap, very high trap density and an at least 100 times reduced carrier mobility.

Another benefit of embodiments is that the use of such a substrate avoids the generation of a surface channel at the surface of the semiconductor, which otherwise (for a conventional substrate) is formed by an accumulation or inversion layer. Such a surface channel results in a lossy surface current between resonators and/or interconnections of different potential. As a consequence, a BAW device on such a substrate will feature lower loss, which means that the BAW filters comprise an improved insertion loss, or the BAW resonators comprise an improved quality factor (Q). Thereby, the improvement depends but is not limited to the previously present surface channel, the dielectric layers between the conducting layers and the geometrical layout of the filter.

Hence, a subject of embodiments of the present invention comprises the use of semiconductor substrates for a BAW device, wherein monocrystalline lattice structures are converted into a non-monocrystalline (non-crystalline) structure in a surface region on the side, on which the BAW device and interconnections are mounted. This non-crystalline surface region particularly avoids the formation of the MIS capacitance between the semiconducting substrate and the BAW devices and/or its interconnection. The non-crystalline structures may be formed either by deposition of a non-crystalline structure or by a destruction of the present monocrystalline structure of the substrate.

An alternative/additional possibility is given by a surface treatment of a semiconductor substrate for a device comprising a BAW device, such that the voltage dependence of the MIS capacitance is significantly reduced. Thereby, embodiments of the present invention provide an acoustical device on a passivated substrate.

FIG. 1 shows a first embodiment of the present invention, in which a bulk acoustic wave device comprises a semiconductor substrate 110 with a surface region 112, an isolating layer 120, and a piezoelectric layer 130 sandwiched by a first electrode 140 and a second electrode 150, wherein the isolating layer 120 is arranged between the surface region 112 and the second electrode 150. According to embodiments the surface region 112 can comprise a same material as the substrate 110, but in which the semiconductor exhibits an increased bandgap, very high trap density and about 100 times reduced carrier mobility when compared to the bulk part of the substrate 110. This can, for example, be achieved by changing (e.g., damaging or destroying) the lattice structure of the semiconductor substrate 110 within the surface region 112. In particular, one possibility comprises forming a polycrystalline or amorphous material out of the material of the semiconductor substrate 110. If, for example, the semiconductor substrate 110 comprises a silicon, the surface region 112 can comprise amorphous or polycrystalline silicon.

In the embodiment as shown in FIG. 1 the BAW device comprises a BAW resonator, wherein the first electrode 140 is connected with a first terminal 142 and the second electrode 150 is connected with a second terminal 152. The isolating layer 120 can optionally comprise an acoustic mirror, which suppresses acoustic waves from propagating into the semiconductor substrate 110 so that an acoustic decoupling of the BAW resonator from the semiconductor substrate 110 is achieved. The surface region 112 comprises a thickness d, which can be chosen such that a voltage dependent MIS capacitance between the second electrode 150, the isolating layer 120 and the semiconductor substrate 110 is suppressed.

Figure 2:
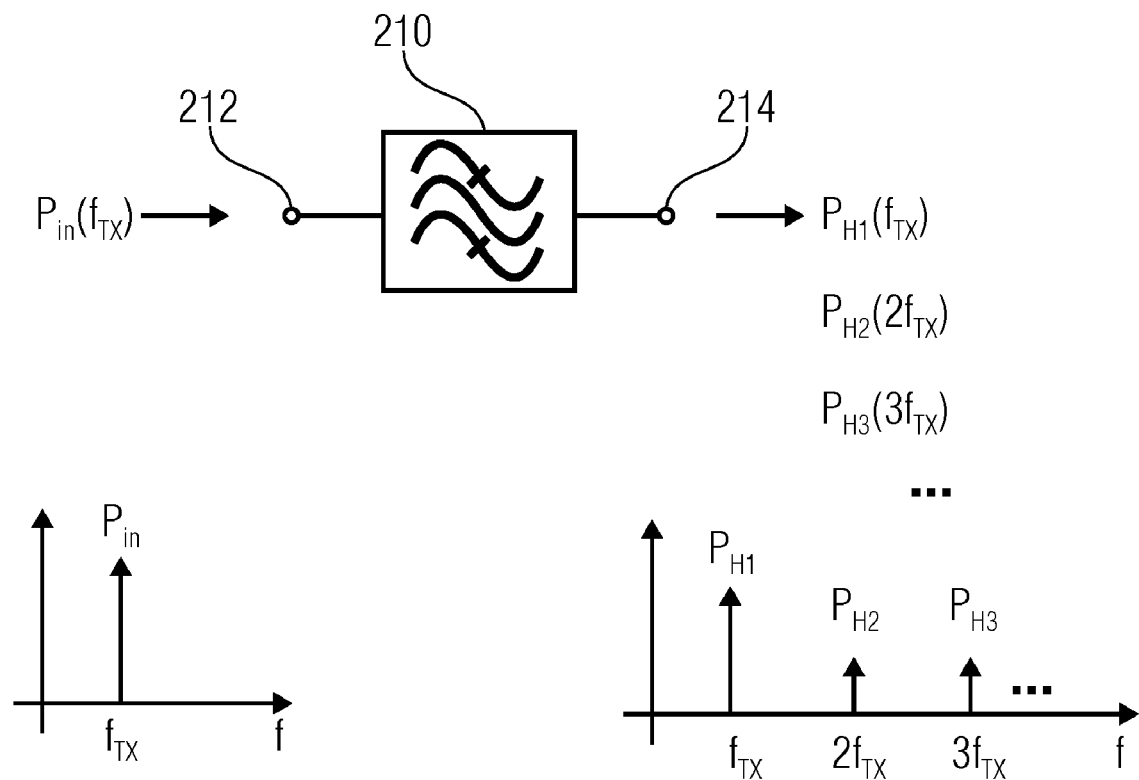
FIG. 2 shows an example for generation of high harmonics.

FIG. 2 shows an example for a generation of higher harmonics. High harmonics are, for example, generated due to the nonlinear behavior of a filter 210 comprising, for example, an input 212, an output 214 and a bulk acoustic wave device. A high power signal $P_{in}$, which depends on a frequency $f_{TX}$, is applied to nonlinear filter 210, wherein the exemplary high power signal $P_{in}$ comprises a continuous wave with the frequency $f_{TX}$. As a consequence of the nonlinearity of the nonlinear filter 210, the respective signal at the output 214 of the nonlinear filter 210 comprises out of a fundamental mode $P_{H1}$ comprising the frequency $f_{TX}$, also higher harmonic tones are excited. A second harmonic $P_{H2}$ with twice the frequency $f_{TX}$, and a third harmonic $P_{H3}$ with three times the frequency $f_{TX}$.

FIG. 2 shows also the corresponding spectral representations for the high power signal $P_{in}$ at the input 212 and, in addition, the corresponding spectral representation of output modes at the output 214. The amplitudes of the fundamental mode $P_{H1}$, of the second harmonic $P_{H2}$ and of the third harmonic $P_{H3}$ are lowered when compared to the high power signal $P_{in}$, wherein the fundamental mode $P_{H1}$ is the dominant mode with respect to the second and third harmonic $P_{H2}$ and $P_{H3}$. But the excitation of the second and third harmonic $P_{H2}$ and $P_{H3}$ can yield perceivable artifacts and hence should be sufficiently (below a perception level) be suppressed. In addition to the second and third harmonic $P_{H2}$ and $P_{H3}$ further higher harmonics will be excited, although they are not shown in the FIG. 2.

FIG. 3 shows an example for an intermodulation in a duplexer. Again, a high power signal $P_{in}$ comprising, for example, a continuous wave is applied to a TX input of a duplexer 310, which comprises out of a TX bandpass filter 314, a RX bandpass filter 316 and a matching circuit 318 arranged in-between the bandpass filter 314 and 316, and an antenna port 319. Hence, the duplexer 310 comprises a TX input, a RX output and the antenna port 319. The frequency of the high power signal $P_{in}$ lies in the passband of the TX filter 314. In this example, another continuous wave signal $P_{int}$ is simultaneously applied to the antenna port 319 and this other continuous wave signal $P_{int}$ is also called interferer. The frequency of the high power signal is $f_{TX}$ and the frequency of the interferer $P_{int}$ is $f_{int}$. If the duplexer 310 comprises a nonlinear behavior, the two signals ($P_{in}$ and $P_{int}$) are intermodulated. As a consequence, tones at combinations of the two signal frequencies ($f_{TX}$ and $f_{int}$) are generated. The frequency of the interferer $P_{int}$ can be such that the desired nth-order intermodulation product (e.g., $f_{int}=2f_{TX}-f_{RX}$), lies in the passband of the RX filter 316. Thus, the intermodulation product can be measured at the RX output since it will not be damped by the stopbands of the RX filter 316.

FIG. 3 shows also the spectral representation of the high power signal $P_{in}$, of the interferer $P_{int}$ and the intermodulated signal $P_{mod}$. In this simple example it is assumed that the high power signal $P_{in}$ comprises a continuous wave with the frequency $f_{TX}$ and, similarly, the interferer signal $P_{int}$ comprises the frequency $f_{int}$. In general the intermodulation signal comprises a plurality of different frequencies at different order, for example, at the second order there will also be a mode comprising the frequency $f_{int}=f_{RX}-f_{TX}$ and another mode comprising the frequency $f_{RX}+f_{TX}$, at the third order the frequency $2f_{TX}-f_{RX}$ is accompanied by further modes. Higher orders modes are, in general, present too. Most of these modes will be damped by the RX filter 316, which comprises a passband at the frequency $f_{RX}$, whereas the TX filter 314 comprises a passband at the frequency $f_{TX}$.

Figure 4A:
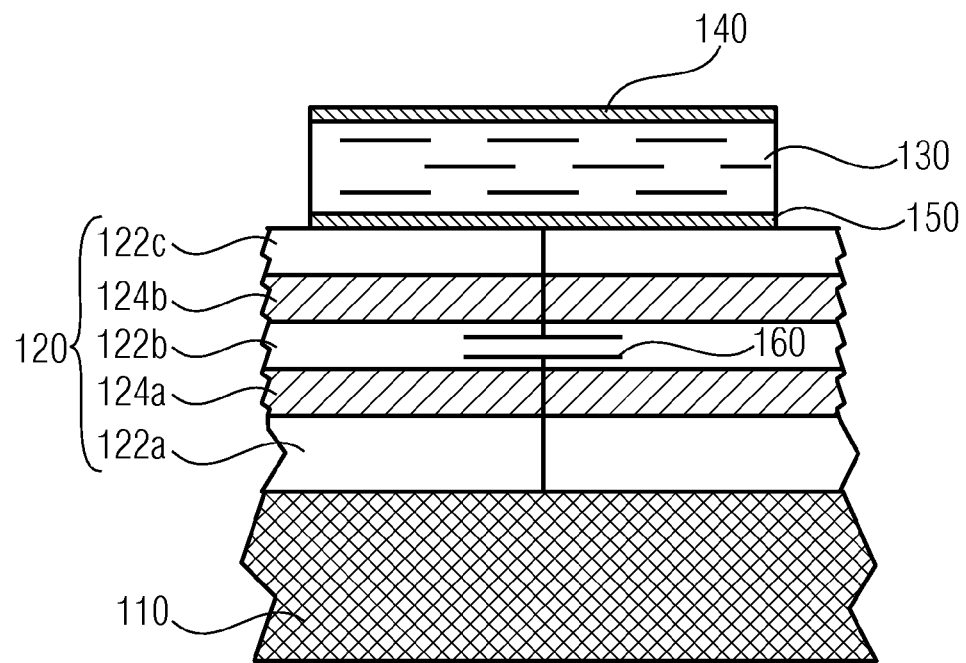
FIGS. 4a to 4c show examples for MIS capacitances between resonators and the substrate.
Figure 4B:
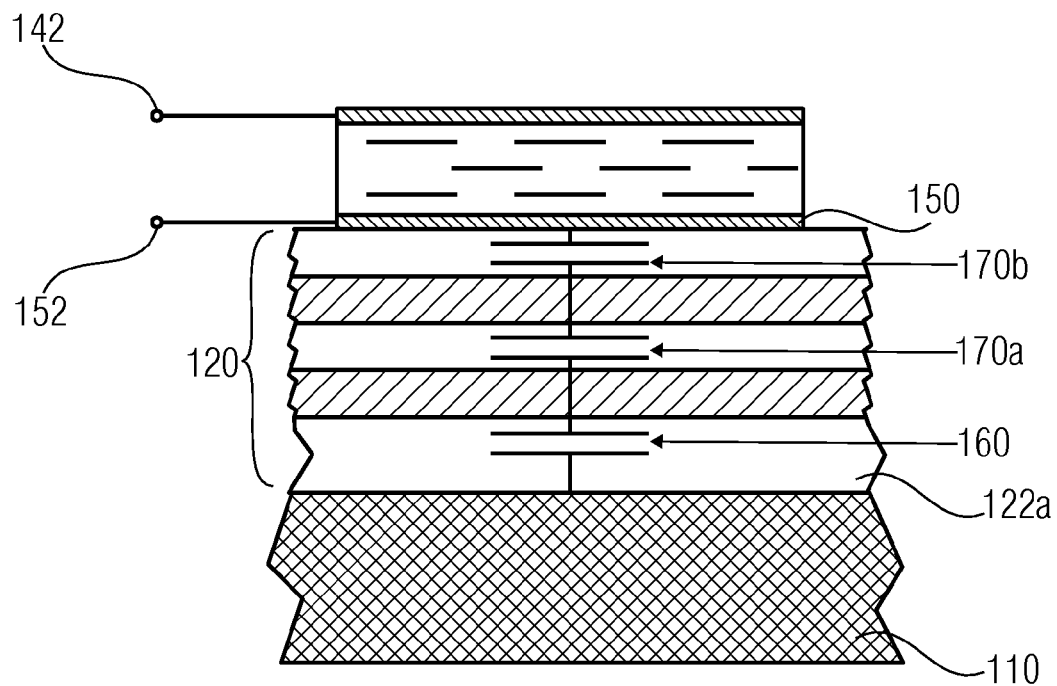
Figure 4C:
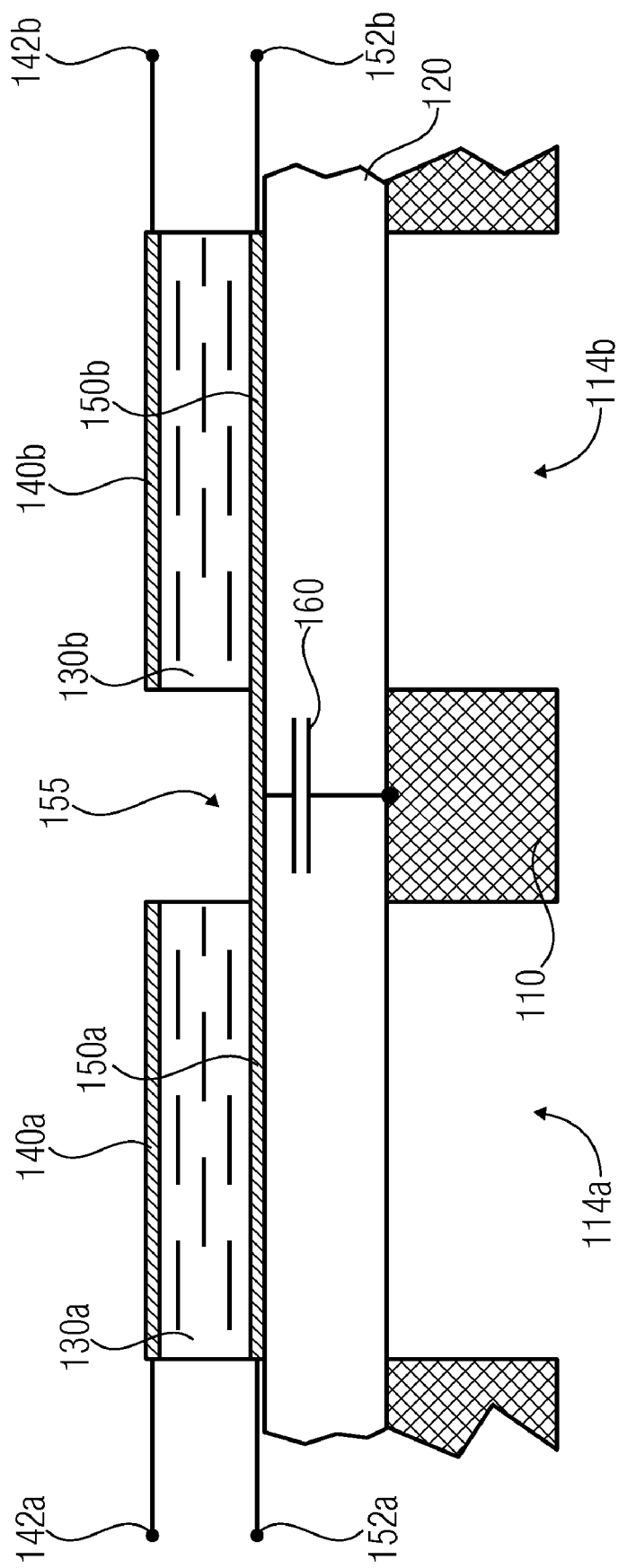

FIGS. 4a to 4c show an example for a BAW device as an SMR or a membrane type device.

FIG. 4a shows an SMR (Solidly Mounted Resonator) with a dielectric mirror comprising a stack of layers of alternating high and low acoustic impedances arranged within the insulating layer 120. For example, on the substrate 110 a first layer of low acoustic impedance 122a is formed, on which a first layer of high acoustic impedance 124a, on which a second layer of low acoustic impedance 122b, ... are formed. On the last layer of low acoustic impedance 122c, the second electrode 150 is formed, on which the piezoelectric layer 130 and the first electrode 140 are formed. The acoustic mirror in FIG. 4a comprises dielectric materials for both the layer of low and high acoustic impedance 122, 124 and, therefore, a MIS capacitance 160 appears between the second electrode 150 and the semiconductor substrate 110, wherein the second electrode 150 comprises, for example, a metal and the semiconductor substrate 110 comprises, for example, silicon. All layers of the acoustic mirror act in this example as insulator for the MIS capacitance.

FIG. 4b shows a BAW device, wherein the acoustic mirror 120 arranged within the insulating layer 120 comprises again a layer stack of high and low acoustic impedance 124,122, but wherein the high acoustic impedance materials 124 comprises a conductive material and the low acoustic impedance material 122 comprises a dielectric material. As consequence, mirror capacitances 170 will be excited between the conductive materials of the second electrode 150 and the second layer of high acoustic impedance 124b, and the first and second layer of high acoustic impedance 124a,b. In addition, a MIS capacitance 160 will be excited between the first layer of high acoustic impedance 124a and the semiconductor substrate underneath the first layer of low acoustic impedance 122a.

FIG. 4c shows a membrane type BAW device, wherein a first BAW resonator comprises a first piezoelectric layer 130a sandwiched between a first electrode 140a and a second electrode 150b, and a second BAW device comprises a second piezoelectric layer 130b sandwiched between a further first electrode layer 140b and a further second electrode layer 150b. The second electrode 150a and the further second electrode 150b are connected by an interconnection 155. The second and the further second electrode 150a,b and the interconnection 155 are arranged on the insulating layer 120 and the insulating layer 120 is supported by the substrate 110 such that the substrate 110 forms cavities 114a,b (air interface) in the propagation direction of acoustic waves, which means below the first and second BAW resonator. Therefore, the insulating layer 120 is arranged between the first cavity 114a and the second electrode 150a, and the insulating layer 120 is also arranged between the second cavity 114b and the further second electrode 150b.

In addition, the first electrode 140a is connected to a first terminal 142a and the second electrode 150a to a second terminal 152a, and the further first electrode 140b is connected to a further first terminal 142b and the further second electrode 150b is connected to a further second terminal 152b. The insulating layer 120 ensures mechanical stability of the first and second BAW resonator and the first and second cavity 114a and 114b provide an acoustical decoupling of the first and second BAW resonators from the substrate 110 (so that the acoustic wave cannot propagate into the substrate 110).

As in the FIGS. 4a and 4b also here a MIS capacitance 160 is excited between the interconnection 155 and the semiconductor substrate 110, which are separated by the insulating layer 120.

Figure 5A:
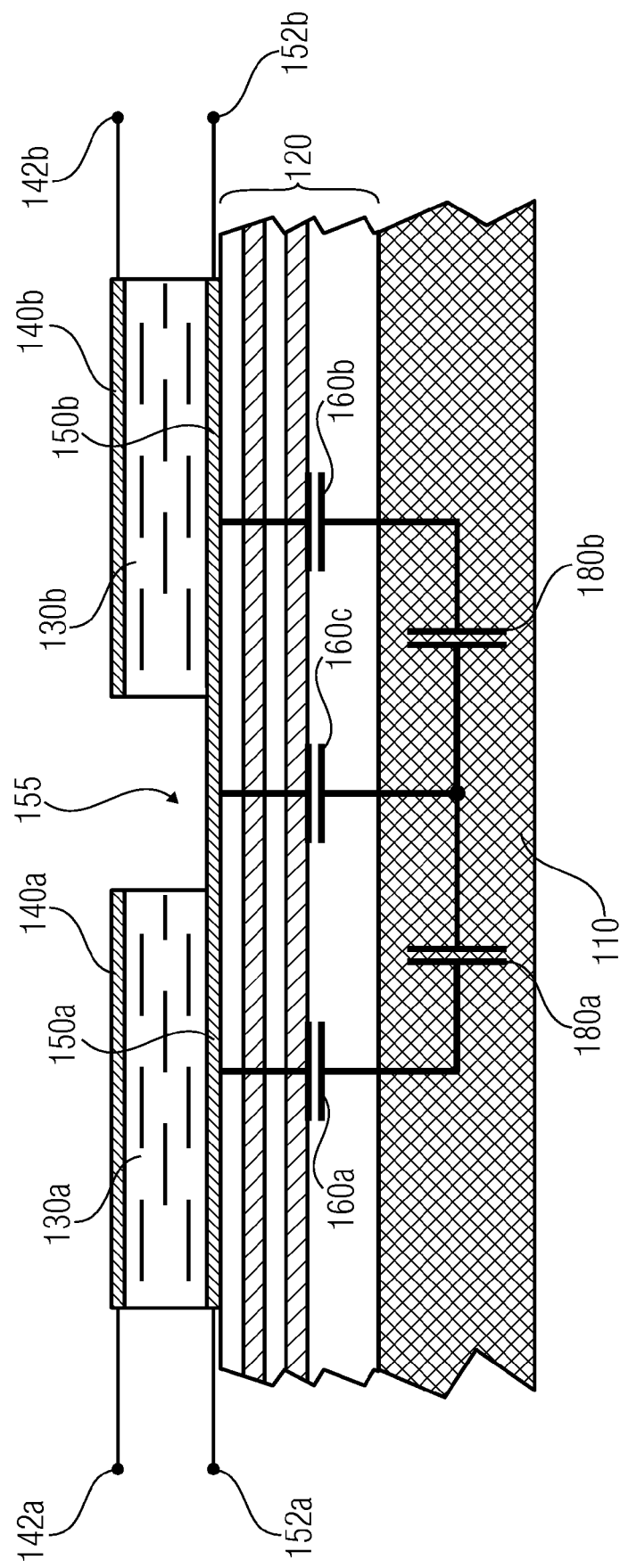
FIG. 5a to 5c show examples for excitation of a nonlinearity.
Figure 5B:
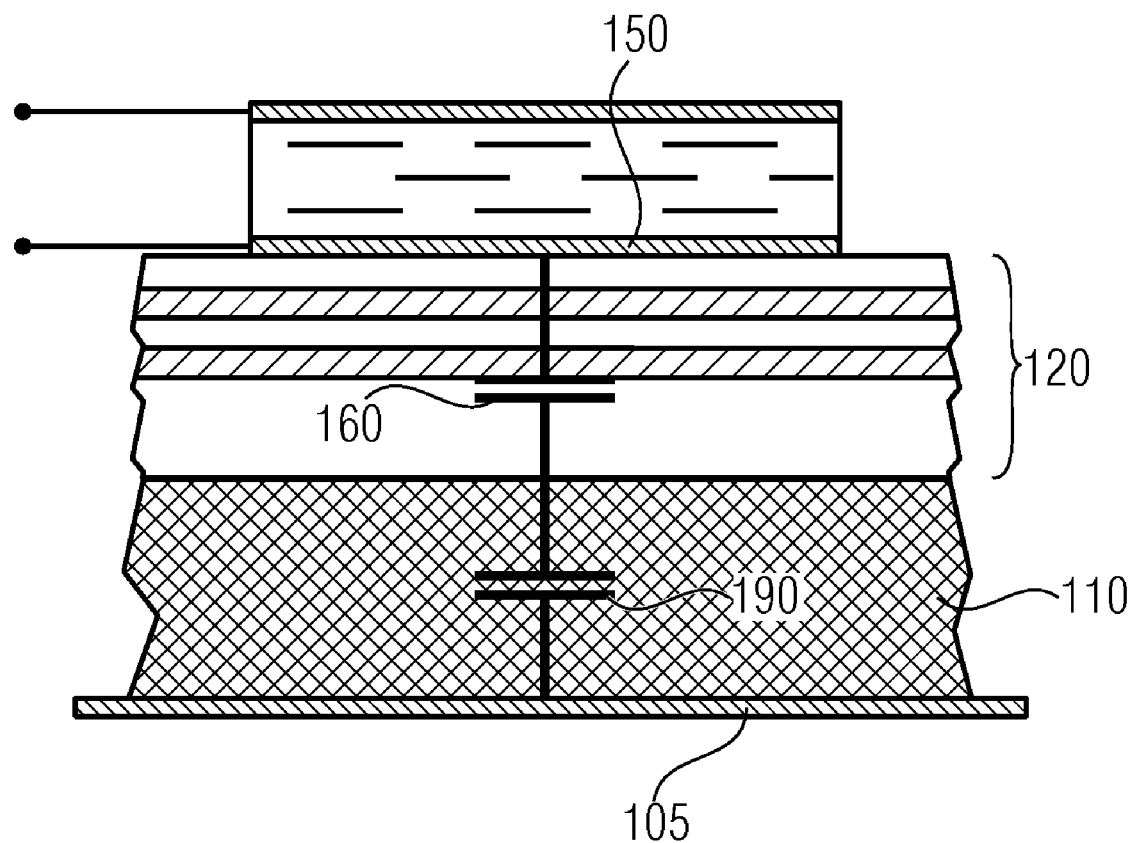
Figure 5C:
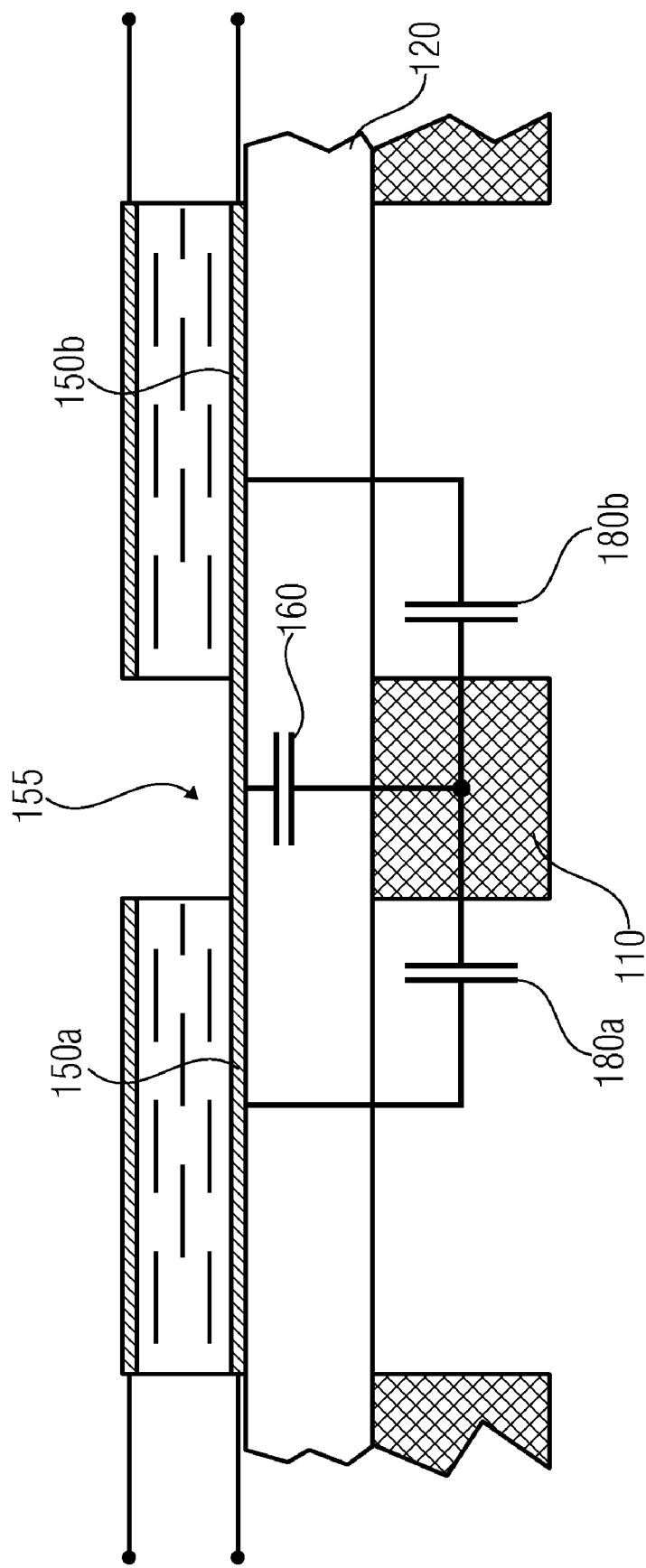

FIGS. 5a to 5c show examples for the excitation of nonlinearity. FIG. 5a is an example for a SMR BAW, wherein a first BAW resonator comprising a first piezoelectric layer 130a sandwiched by a first electrode 140a and a second electrode 150a and a second BAW resonator with a second piezoelectric layer 130b sandwiched by a further first electrode 140b and a further second electrode 150b. The second and the further second electrode 140a and 140b are connected by the interconnection 155 and are formed on the insulating layer 120 comprising an acoustic mirror as explained in the FIG. 4a or 4b. The acoustic mirror is again formed on a substrate 110 and the first and second electrodes are connected to first and second terminals 142 and 152.

In this example, a first MIS capacitance 160a is excited between the second electrode 150a and the substrate 110, a second MIS capacitance 160b is excited between the further second electrode 150b and the substrate 110, and a third MIS capacitance 160c is excited between the interconnection 155 and the substrate 110. In addition, a first fringe capacitance 180a is excited between the first MIS capacitance 160a and the third MIS capacitance 160c, and a second fringe capacitance 180b is excited between the third MIS capacitance 160c and the second MIS capacitance 160b. In operation, a fringing field between the resonator and the interconnection excites the MIS capacitances 160.

FIG. 5b shows an example of a BAW SMR, which is mounted above a ground plane 105, so that the ground 105 is arranged on a surface of the substrate 110, which is opposite to the surface on which the insulating layer 120 and the bulk acoustic wave device is formed. As consequence, a MIS capacitance 160 is excited between the second electrode 150 and the semiconductor substrate 110 and, in addition, a substrate capacitance 190 will be formed between the MIS capacitance 160 and the ground plate 105. The MIS capacitance 160 is excited by an electric field between the BAW resonator and the ground plane 105.

FIG. 5c shows again a membrane type device (as shown in FIG. 4c) wherein in addition to the MIS capacitance 160 excited between the interconnection 155 and the substrate 110 a first fringe capacitance 180a is excited between the second electrode 150a and the substrate 110 and a second fringe capacitance 180a is excited between the further second electrode 150b and the substrate 110. Therefore, the MIS capacitance 160 underneath the interconnection 155 between two membrane type resonators is excited by a fringing field between the resonators and the interconnect 155.

In this example, again an insulating layer 120 is formed between the second and further second electrode layer 150a and 150b and the substrate 110 and this insulating layer 120 serves, for example, as a mechanical support for both BAW resonators. This insulating layer 120 can, for example, comprise an oxide or other dielectric materials, which provide a sufficient support for the BAW resonators.

According to embodiments of the present invention, the nonlinear behavior related to the MIS capacitances 160 can be suppressed or avoided by changing the substrate 110 within a surface region 112.

Figure 6A:
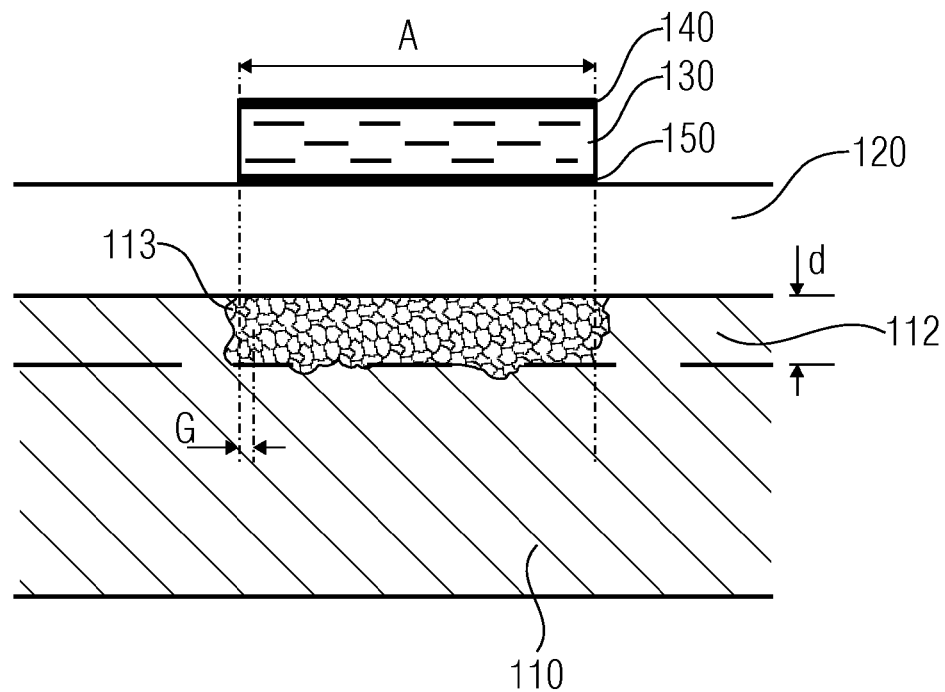
FIGS. 6a and 6b, collectively

FIG. 6a shows a BAW device according to embodiments. The BAW device comprises a piezoelectric layer 130 sandwiched by the first electrode 140 and the second electrode 150 over a resonator region A. The BAW resonator is formed on the insulating layer 120 so that the insulating layer 120 is arranged between the second electrode 150 and the substrate 110. According to embodiments, the substrate 110 comprises a surface region 112, with an increased bandgap, very high trap density and/or an reduced carrier mobility. This can be achieved, for example, by a deterioration of the lattice structure of the semiconductor substrate 110, for example, by forming a polycrystalline or an amorphous material within the surface region 112.

In FIG. 6a, as an example, the formation of a polycrystalline surface region is shown, wherein the polycrystalline surface region 112 comprises a material formed by grains 113, wherein each grain comprises a mean size G (for example, related to an average diameter of the plurality of grains). In the embodiment as shown in FIG. 6, the surface region 112 comprises a thickness d and is arranged below the BAW resonator implying that the surface region 112 is arranged between the second electrode 150 and the substrate 110. According to embodiments, the grain size G is such that G is much smaller than the thickness d, and G is also much smaller than the resonator area A. Much smaller can, for example, mean that G is smaller 1/10 or 1/100 of the thickness d and/or area A. This ensures that underneath the BAW resonator no large grains are formed so that again an MIS capacitance between the large grains and the second electrode 150 can be excited. The grain size G as well as the thickness d can be optimized in a way that the energy band structure of the semiconductor substrate is deteriorated and no voltage dependent MIS capacitance 160 is excited between the BAW resonator and the substrate 110.

According to further embodiments, the surface region 112 is only arranged underneath the BAW resonator and does not cover the whole substrate surface, over which the insulating layer 120 is arranged. Such limitation on the extent of the surface region 112 can be made as long as the voltage dependence of the MIS capacitance 160 is suppressed to a sufficient order.

Figure 6B:
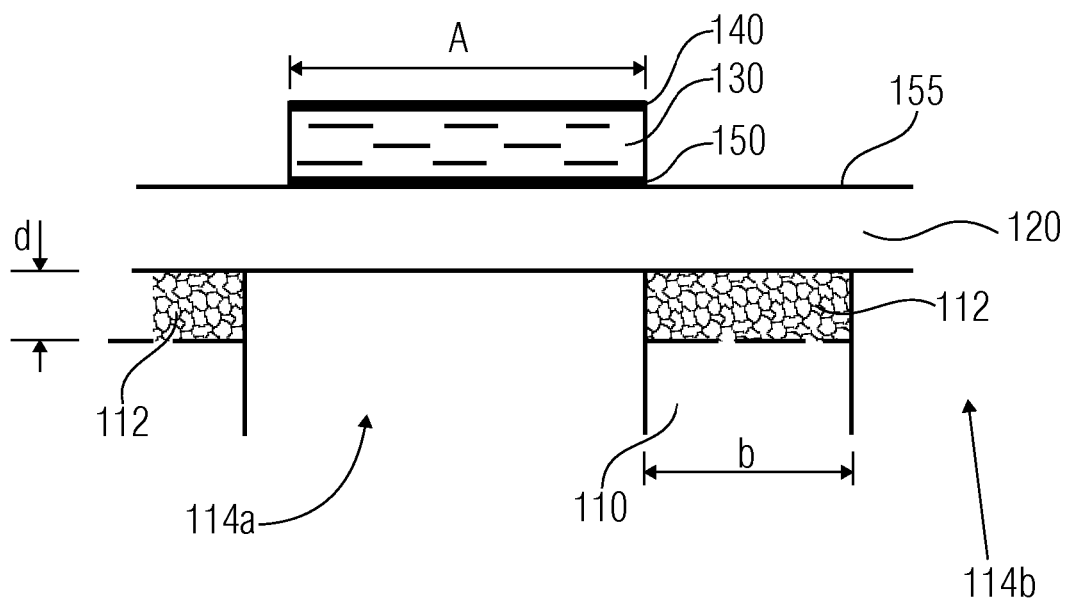

FIG. 6b shows a further embodiment in which a membrane BAW device by using the insulating layer 120 as support and the substrate 110 forms the cavity 114 below the BAW device. The BAW device comprises again a piezoelectric layer 130 sandwiched by a first electrode 140 and a second electrode 150 over the resonator region A, wherein the cavity 114 is formed underneath the resonator region A and the second electrode 150 is connected with the interconnection 155. The cavity 114 can also be arranged such that the cavity 114 is larger than the resonator region A or comprises approximately the same size or is smaller than the resonator region A. According to embodiments the substrate 110 comprises again a surface region 112 arranged between the substrate 110 and the insulating layer 120 so that the MIS capacitance between the interconnection 155 and the substrate 110 is suppressed. Again, the surface region 112 can comprises a polycrystalline structure with a grain size G chosen such that G is smaller than the thickness d and, at the same time, G is also smaller than a width b of the substrate 110 between two neighboring cavities 114a and 114b. The width b defines at the same time an interconnection size of the interconnection 155.

There are different possibilities for forming the surface region 112. One example is given by a deposition of amorphous silicon on the substrate, which can comprise, for example, silicon, wherein prior to standard SMR BAW process the substrate 110 can be processed in the following way. In the following silicon will be mainly used as one example, although embodiments of the present invention apply also to other semiconductor material.

First, the native oxide on the silicon substrate can be removed, such that the amorphous silicon grows directly on the monocrystalline silicon. Obviously, without this removal, a MIS capacitance 160 would be excited on the surface of the substrate 110, since an insulator terminates the monocrystalline structure. As a consequence the nonlinearity would still persist. This removal can be done, for example, by either a wet-etch, a high temperature treatment, a hydrogen bake, a hydrogen plasma, sputtering or a combination of these methods. The oxide removal can be followed by the deposition of amorphous silicon. This can, for example, be done by sputtering, either PECVD or CVD (Chemical Vapor Deposition). Thus, a transition from the monocrystalline silicon structure in the substrate 110 to the amorphous one is achieved, avoiding the formation of a MIS capacitance 160 (that means avoiding an accumulation, depletion or inversion layer) at the silicon surface. In order to avoid the MIS capacitance 160, it is needed that the silicon does not terminate on an insulator, but instead an interface is formed which interpolates between the semiconductor properties of a monocrystalline substrate 110 and the insulating material 120.

Figure 7:
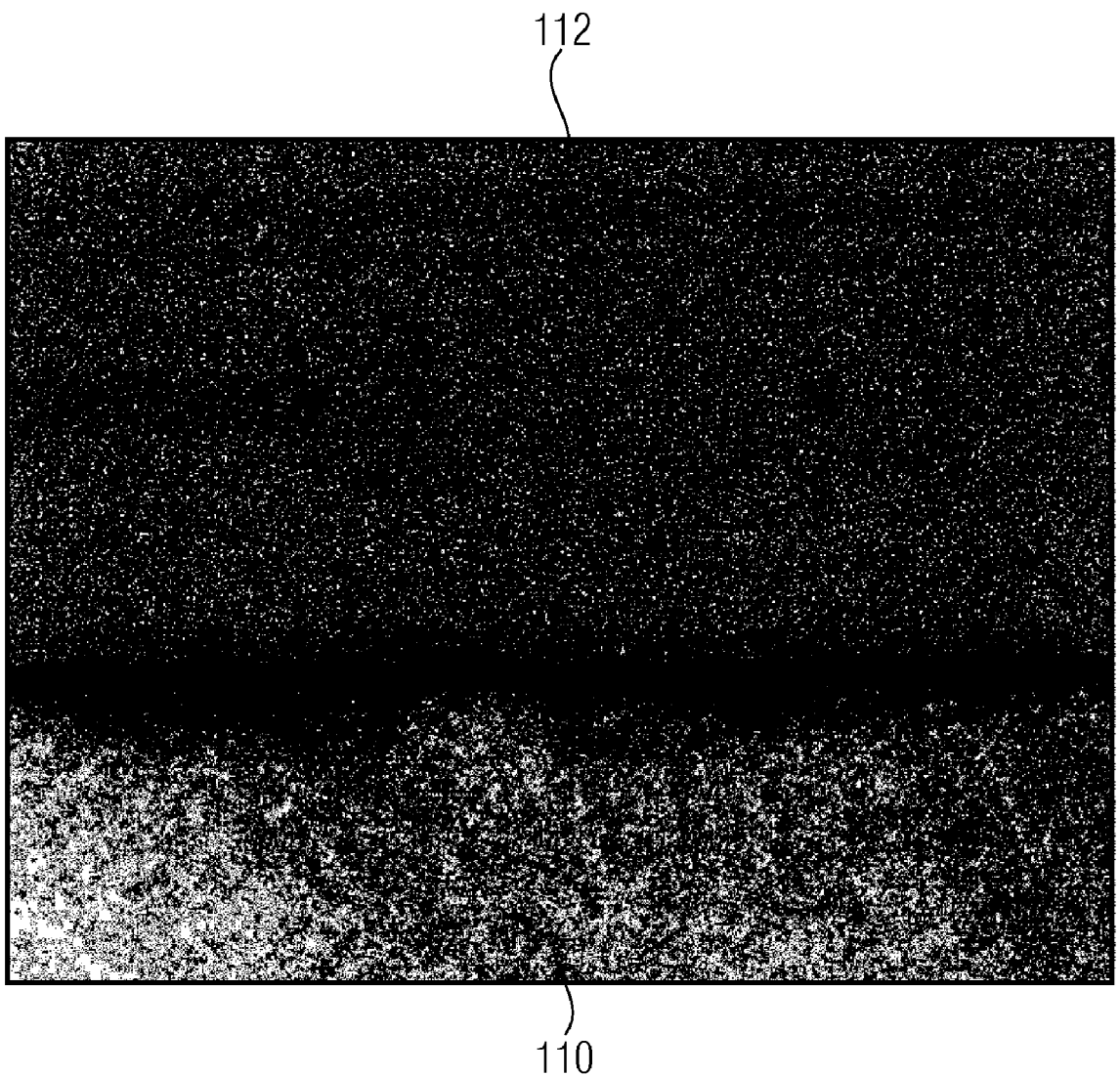
FIG. 7 shows a cross-sectional view through a substrate with an amorphous silicon layer.

FIG. 7 shows a cross sectional view on such a processed substrate 110, where the amorphous silicon 112 deposition was followed by an oxide removal.

The effect of the amorphous silicon layer, as can be shown in the cross sectional view through the amorphous silicon processed wafer in FIG. 7, can be demonstrated by a capacitance versus voltage measurement (C=C(V)-measurement) of the series capacitance chain between the lower electrode 150 and the substrate 110, which exhibits the MIS capacitance 160 (See FIG. 4b).

Figure 8A:
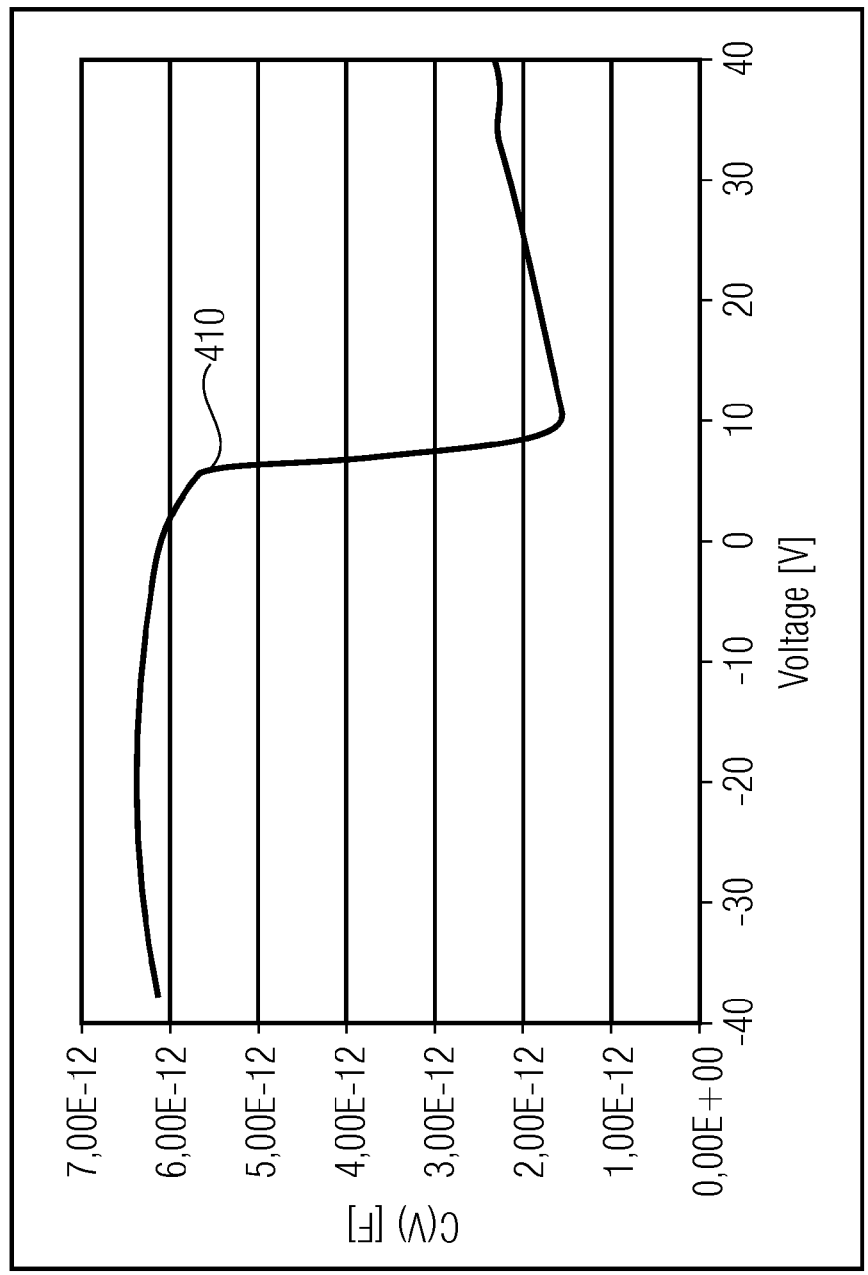
FIG. 8a shows a voltage dependent capacitance when using a conventional substrate.
Figure 8B:
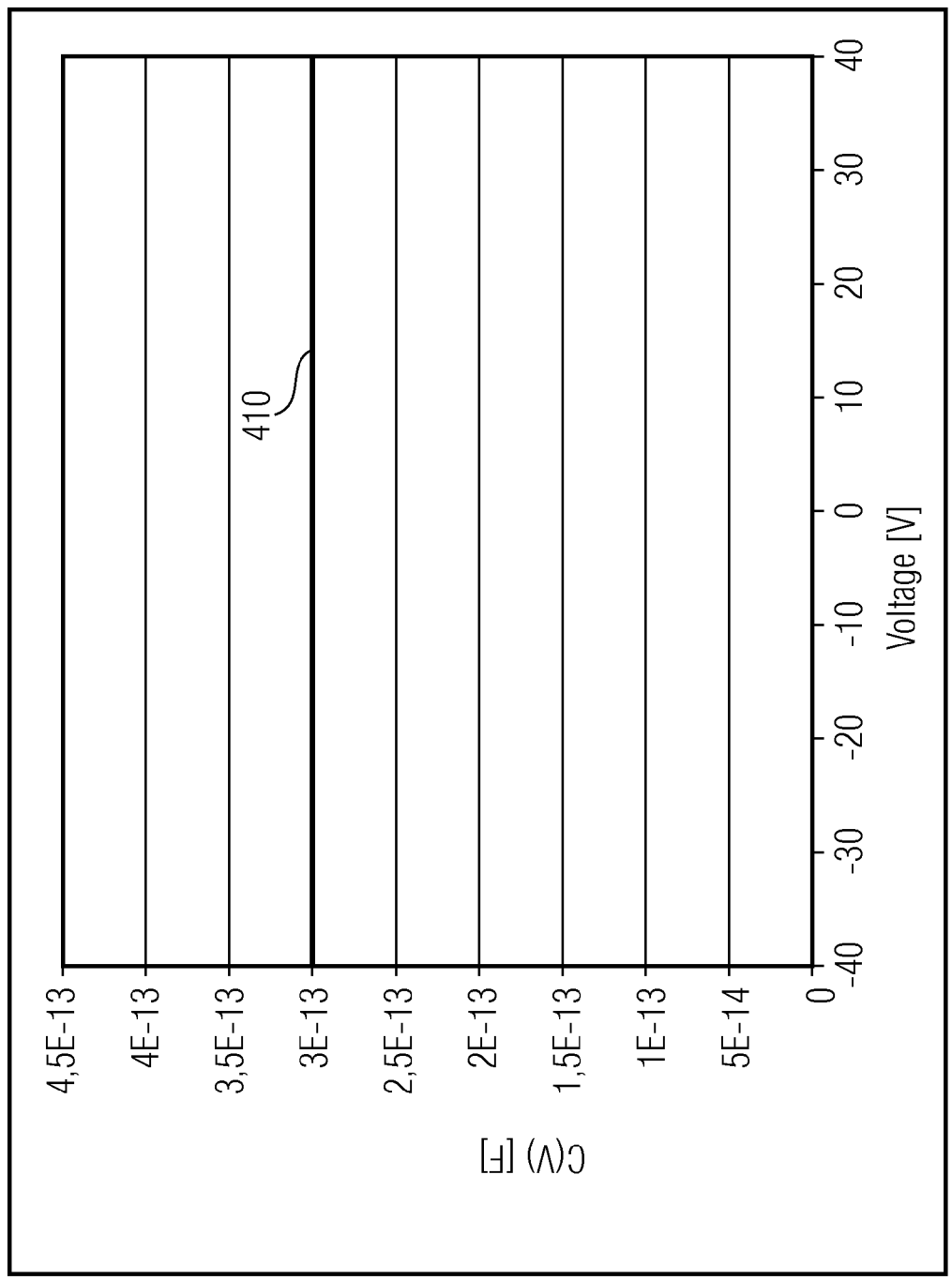
FIG. 8b shows a voltage independent capacitance when using a substrate according to embodiments.

FIG. 8a shows the dependence of the MIS capacitance C(V) as a function of the applied voltage. The graph 410 shows with growing voltage a sharp decrease around 7 to 8 volt by a factor of around 3, after which a slightly increase in the capacitance appears. FIG. 8b shows the same capacitance C(V)-measurement, but for a wafer in which the substrate 110 comprises a surface region 112 in accordance to embodiments of the present invention. As shown in FIG. 8b the graph 410 remains almost constant around the value of $3*10^{-13}$ F, which is by one magnitude (factor of around 10) smaller than the capacitance as shown for the voltage dependent case in FIG. 8a (capacitance measurement for a monocrystalline silicon-oxide transition). FIG. 8b shows the capacitance measurement for an amorphous silicon-oxide transition. Therefore, FIG. 8a shows the C(V)-measurement for a conventional wafer and FIG. 8b, the C(V)-measurement for a wafer treated with the aforementioned process. Clearly, the voltage dependence of the capacitance vanishes and as a consequence the non-linearity of the filter.

The capacitance does not disappear, but the voltage dependence is not present anymore and this voltage dependence was one important origin of the nonlinearity and hence the nonlinearity vanishes.

Figure 9:
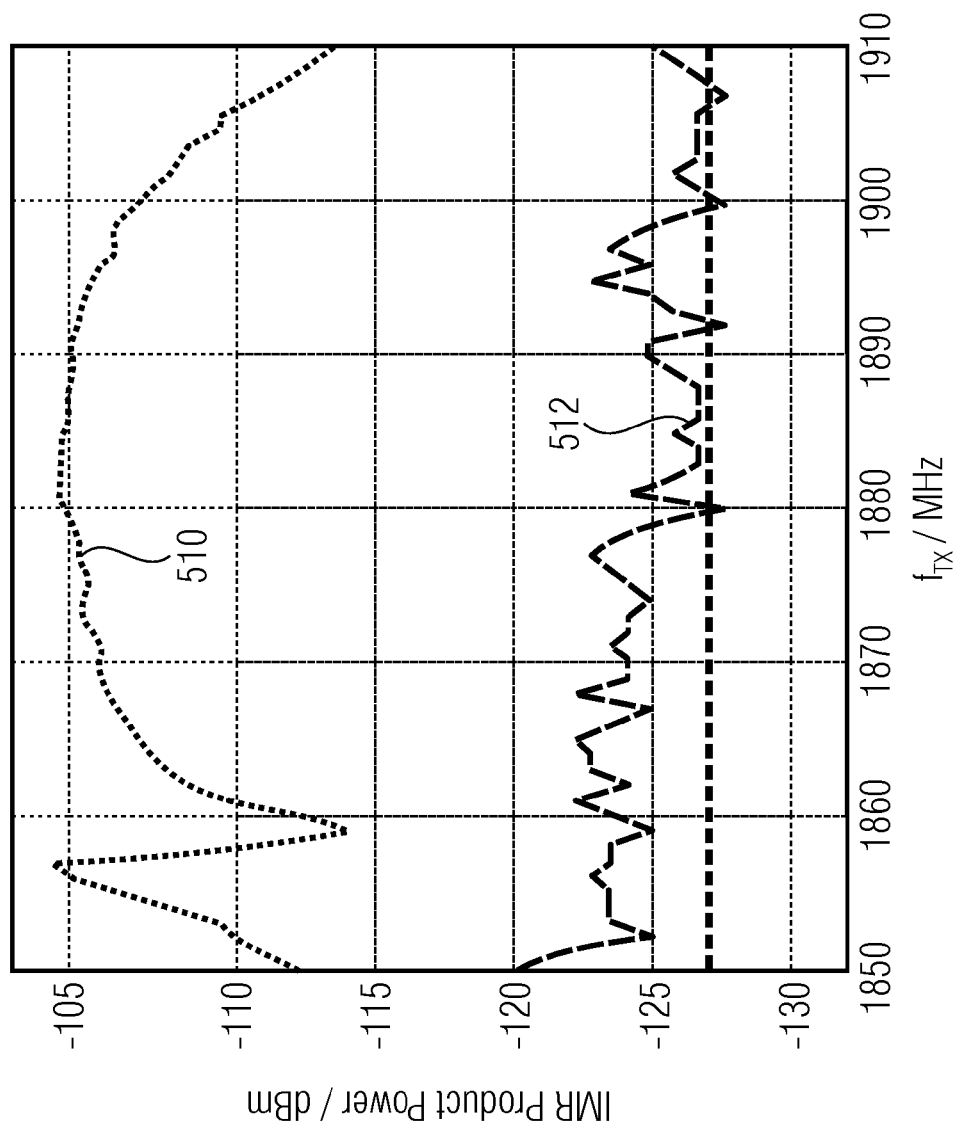
FIG. 9 shows a third order intermodulation measurement for a duplexer.

FIG. 9 shows a comparison of a third order intermodulation measurement for two PCS-Duplexers. The graph 510 comprises an intermodulation measurement for a PCS duplexer using a TX filter without amorphous silicon processed substrate 110 (monocrystalline silicon substrate) and the second graph 512 shows an intermodulation measurement of a PCS duplexer using a TX filter with an amorphous silicon processed substrate. Therefore, in one case (graph 510) the TX filter was processed on a standard silicon substrate 110 and in the other case (graph 512) the substrate 110 according to embodiments with deposited amorphous silicon surface region 112 is used. At the TX input of the TX filter 310 a signal with a power level of 24 dBm is applied. Its frequency $f_{TX}$ is within the TX passband frequency range from 1850-1910 MHz. An interferer is applied to the antenna with a power level of −17 dBm and a frequency of $f_{int}=f_{TX}-80$ MHz. As a consequence, the third order intermodulation product $2*f_{TX}-f_{int}$ falls into the RX passband range from 1930-1990 MHz and can be measured at the RX output. FIG. 9 shows the measured power level of the 2 cases (with and without the surface region 112). The measurement using the TX die on the substrate 110 with an amorphous silicon surface region 112 (graph 512) comprises a significant lower intermodulation product power level (IMR product power). The resulting level comes from the still present non-linearities in the RX die (RX filter 316).

In further embodiments the surface region 112 is created by an ion bombardment. This alternative method deteriorates the crystal structure of the substrate due to an implantation of ion atoms (ion bombardment). The ion implantation in the substrate 110 amorphizes the substrate 110 within a surface region 112. The ion implantation can be performed with energy above an ion specific limit, and with an implantation dose, which is above the amorphizing dose of the crystalline semiconductor used. The ion specific limit of the energy ensures that the ions are not reflected from the substrate surface but instead are implanted within the substrate within a depth, which will create the surface region 112 with a thickness d. The implantation dose on the other hand will ensure that the crystalline structure of the substrate is deteriorated over the whole area (for example, the resonator area A) and that no larger grains with monocrystalline structure will remain after the ion implantation. An advantage of this method is, that any native oxide on the silicon not necessarily needs to be removed, because the interface monocrystalline to amorphous silicon is formed underneath the native oxide. As mentioned above, this interface is important for the effect that the energy bands of the semiconductor substrate 110 do not terminate on an insulating layer but instead are casted to normal energy levels of isolated atoms thereby avoiding depletion/accumulation zones, which are present in conventional semiconductor materials.

Hence, embodiments of the present invention comprise also a method for treating a surface region of a semiconductor so that the semiconductor substrate 110 gets an increased bandgap, very high trap density and/or an reduced carrier mobility and no MIS capacitance 160 between the semiconductor substrate 110 and a metal layer, which are separated by an insulating layer 120, is formed or at least does not exhibit a voltage dependence capacitance.

In further embodiments, at least one of the first and second electrodes comprise an assembly of layers with materials of different acoustic impedances as, for example, tungsten (W), molybdenum (Mo), palladium (Pd). Especially Mo and W comprise a high conductivity and, moreover, are compatible with CMOS technology. A principle benefit of constructing electrodes comprising a plurality of layers is a higher electromechanical coupling coefficient of the resulting resonator enabling larger filter bandwidths.

In general, the piezoelectric layers can comprise one or more different layers, of which at least one exhibits a piezoelectric activity. The other layers between the top and bottom electrode, that sandwich the piezoelectric layer, can be non-piezoelectric-active dielectric or other layers to achieve special performance effects like temperature coefficient compensation or to facilitate manufacturing like adhesion layers. In addition, the other layers are typically thin when compared to "real" piezoelectric (active) layer.

Finally, possible materials for layers with high acoustic impedance comprise, for example: W, Mo, Pt, Ta, TiW, TiN, Ir, WSi, Au, $Al_2O_3$, SiN, $Ta_2O_5$ and zirconium-oxide, wherein the last four are dielectrical materials. Possible materials for the piezoelectric layers are, for example, AlN, ZnO, PZT and $LiNbO_3$. A material for lower acoustic impedance is, for example, aluminum.

What is claimed is:

1. A bulk acoustic wave (BAW) device comprising:
   a semiconductor substrate with a surface region;
   an insulating layer formed over the surface region; and
   a piezoelectric layer sandwiched by a first and second electrode, wherein the second electrode is formed over the insulating layer;
   wherein the surface region is processed such that a voltage dependence of a capacitance between the substrate and the second electrode is substantially suppressed.

2. The BAW device of claim 1, wherein the semiconductor substrate comprises a bulk region and wherein, when compared to the bulk region, the surface region has an increased bandgap, a very high trap density and/or a reduced carrier mobility.

3. The BAW device of claim 1, wherein the insulating layer comprises an acoustic mirror, the acoustic mirror comprising a layer stack of alternating high and low acoustic impedances.

4. The BAW device of claim 1, wherein the surface region comprises a same material as the substrate, but with a lattice structure converted into an amorphous or polycrystalline material.

5. The BAW device of claim 1, wherein the surface region comprises a thickness such that the thickness exceeds an accumulation or depletion zone thickness of the semiconductor substrate.

6. The BAW device of claim 1, wherein the surface region comprises a thickness within a range between of 1 nm and 700 µm.

7. The BAW device of claim 1, wherein the surface region comprises polycrystalline material with an average grain size of more than 10 times smaller than a thickness of the surface region.

8. The BAW device of claim 6, wherein the piezoelectric layer is sandwiched by the first and second electrode over a resonator area, and wherein a grain size is at least 10 times smaller than the resonator area.

9. The BAW device of claim 1, wherein the surface region is formed by deposition of amorphous material on the semiconductor substrate.

10. The BAW device of claim 1, wherein the surface region comprises implanted ion atoms, which deteriorate a monocrystalline lattice structure of the semiconductor substrate.

11. A bulk acoustic wave (BAW) device comprising:
a semiconductor substrate comprising a surface and a bulk region;
an isolating layer formed on a surface region;
a first BAW resonator comprising a first piezoelectric layer sandwiched by a first and second electrode, which is formed on the isolating layer; and
a second BAW resonator comprising a second piezoelectric layer sandwiched by a further first and further second electrode, which is formed on the isolating layer,
wherein the second and further second electrode are electrically connected by an interconnection formed over the isolating layer, and
wherein, when compared to the bulk region, due to a feature of the surface region, a voltage dependence of a capacitance between the substrate and the second electrode is substantially suppressed.

12. The BAW device of claim 11, wherein the surface region has an increased bandgap, a very high trap density and/or an reduced carrier mobility relative to the bulk region.

13. The BAW device of claim 11, wherein the isolating layer comprises an acoustic mirror at a resonator region of the first and second BAW resonator, the acoustic mirror comprising a layer stack of alternating high and low acoustic impedances.

14. The BAW device of claim 11, wherein the semiconductor substrate comprises a first cavity and a second cavity, and wherein the isolating layer is formed between the first cavity and the first BAW resonator, and the isolating layer is formed between the second cavity and the second BAW resonator.

15. The BAW device of claim 13, wherein the isolating layer is formed between the interconnection and the surface region.

16. The BAW device of claim 11, wherein the surface region comprises a same material as the semiconductor substrate, but in a polycrystalline form comprising a plurality of grains of monocrystalline material with an average grain size, which is much smaller than a resonator area and much smaller than an interconnection size.

17. An apparatus comprising:
means for BAW filtering;
means for supporting the means for BAW filtering;
means for insulating the BAW filtering means and the supporting means; and
means for suppressing a voltage dependence of a capacitance, wherein the means for suppressing is formed between the BAW filtering means and the supporting means.

18. The apparatus of claim 17, wherein the means for supporting comprises a semiconductor material, and wherein the means for suppressing comprises a portion of the semiconductor material, the portion of the semiconductor material comprising an increased bandgap, a very high trap density and/or an reduced carrier mobility when compared to the semiconductor material.

19. A method for manufacturing a bulk acoustic wave (BAW) device, the method comprising:
forming a surface region within a semiconductor substrate;
forming an insulating layer on the surface region; and
forming a BAW resonator on the insulating layer, the BAW resonator comprising a piezoelectric layer sandwiched by a first and second electrode;
wherein the surface region is formed such that a voltage dependence of a capacitance between the substrate and the second electrode is substantially suppressed.

20. The method of claim 19, wherein forming the surface region is performed such that the surface region comprises an increased bandgap, a very high trap density and/or a reduced carrier mobility.

21. The method of claim 19, wherein forming the surface region comprises depositing amorphous material on the semiconductor substrate.

22. The method of claim 19, wherein forming the surface region comprises depositing polycrystalline material on the semiconductor substrate.

23. The method of claim 19, wherein forming the surface region comprising implanting ions into the semiconductor substrate with a dose such that a monocrystalline lattice structure is converted into an amorphous or polycrystalline lattice structure.

24. The method of claim 19, further comprising removing oxide material from the semiconductor substrate before forming the surface region.

25. A method for suppressing a nonlinear transmission behavior of a bulk acoustic wave (BAW) filter device formed on a substrate, the method comprising:
forming a surface region within the substrate such that a voltage dependent capacitance between the BAW filter device and the substrate is suppressed,
wherein the surface region is arranged between the BAW filter device and the substrate.

26. The method of claim 25, wherein the forming of the surface region is performed such that the surface region comprises an increased bandgap, very high trap density and/or an reduced carrier mobility within the substrate.

* * * * *